United States Patent
Preusse et al.

(10) Patent No.: US 7,057,485 B2
(45) Date of Patent: Jun. 6, 2006

(54) CURRENT TRANSFORMER FOR A COMPENSATING CURRENT SENSOR

(75) Inventors: Norbert Preusse, Alzenau (DE); Friedrich Lenhard, Hanau (DE); Stefan Schäfer, Rümmelsheim (DE)

(73) Assignee: Vacuumschmelze GmbH & Co. KG (DE)

( * ) Notice: Subject to any disclaimer, the term of this patent is extended or adjusted under 35 U.S.C. 154(b) by 0 days.

(21) Appl. No.: 10/221,086

(22) PCT Filed: Mar. 5, 2001

(86) PCT No.: PCT/EP01/02460

§ 371 (c)(1),
(2), (4) Date: Nov. 22, 2002

(87) PCT Pub. No.: WO01/67117

PCT Pub. Date: Sep. 13, 2001

(65) Prior Publication Data

US 2003/0179063 A1    Sep. 25, 2003

(30) Foreign Application Priority Data

Mar. 7, 2000    (DE) ............................... 100 11 050

(51) Int. Cl.
*H01F 38/20* (2006.01)
(52) U.S. Cl. .................................................. 336/173
(58) Field of Classification Search ............. 336/182, 336/173, 183, 184, 186, 174–175; 324/127
See application file for complete search history.

(56) References Cited

U.S. PATENT DOCUMENTS

| 4,182,982 A |   | 1/1980 | Locke, Jr. et al. |
| 4,492,919 A | * | 1/1985 | Milkovic .................... 324/127 |
| 6,459,349 B1 | * | 10/2002 | Giday et al. ................. 336/178 |

FOREIGN PATENT DOCUMENTS

| DE | 1 025 981 |   | 3/1958 |
| DE | 2 303 906 |   | 10/1973 |
| DE | 195 42 899 A1 |   | 2/1997 |
| EP | 0 294 590 A2 |   | 5/1988 |
| EP | 0 365 219 | * | 4/1990 |
| EP | 0365216 |   | 4/1990 |
| WO | WO 91/19305 | * | 5/1991 |
| WO | WO 91-19305 | * | 5/1991 |

* cited by examiner

Primary Examiner—Tuyen T Nguyen
(74) Attorney, Agent, or Firm—Dean W. Russell; Kristin M. Crall; Kilpatrick Stockton LLP

(57) ABSTRACT

Addressed is a current transformer comprising a primary conductor, a secondary winding and a soft-magnetic core, whereby the primary conductor and secondary winding are electrically insulated from one another and are magnetically intercoupled via the core. In addition, a current to be detected is injected into the primary conductor, and a compensating current is injected into the secondary winding. An additional conductor is provided which is electrically connected in parallel to the primary winding, and which is situated in the area of the core at which a flux rise occurs, whereby the flux rise is at least partially compensated for by the flux elicited by the current flowing in the additional conductor.

10 Claims, 6 Drawing Sheets

Figure 1:
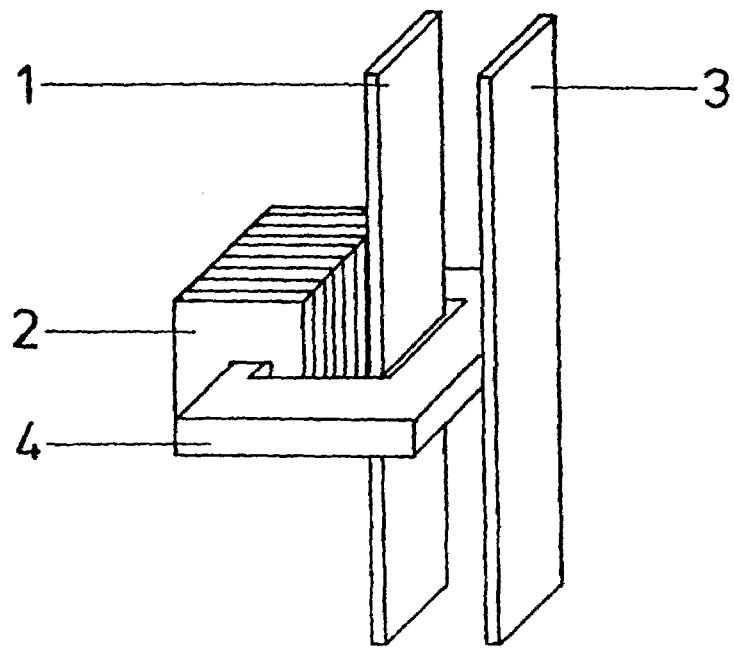

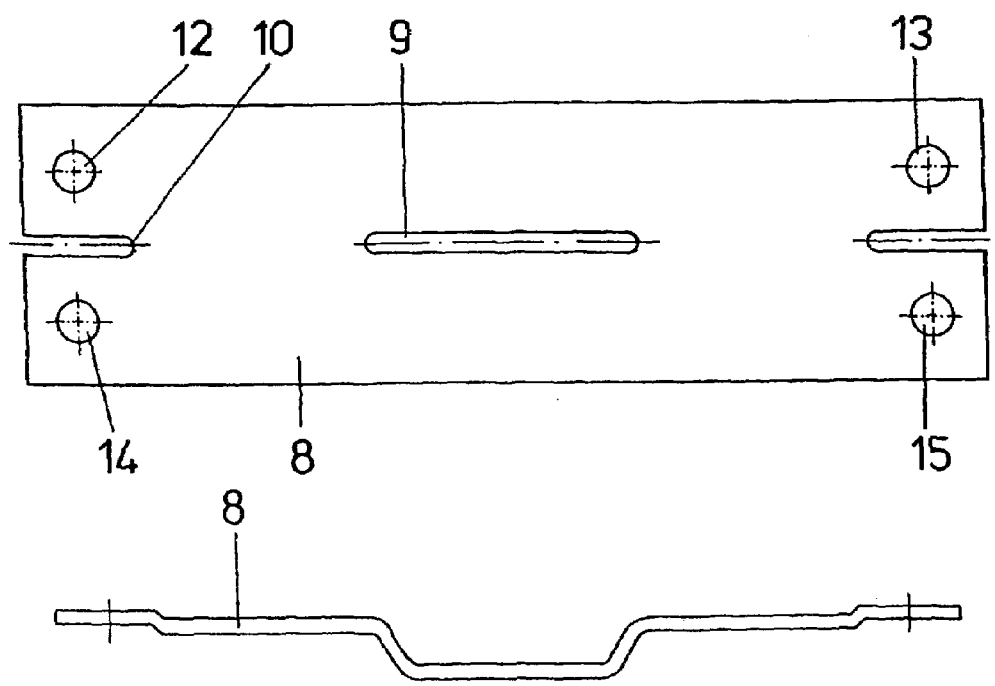
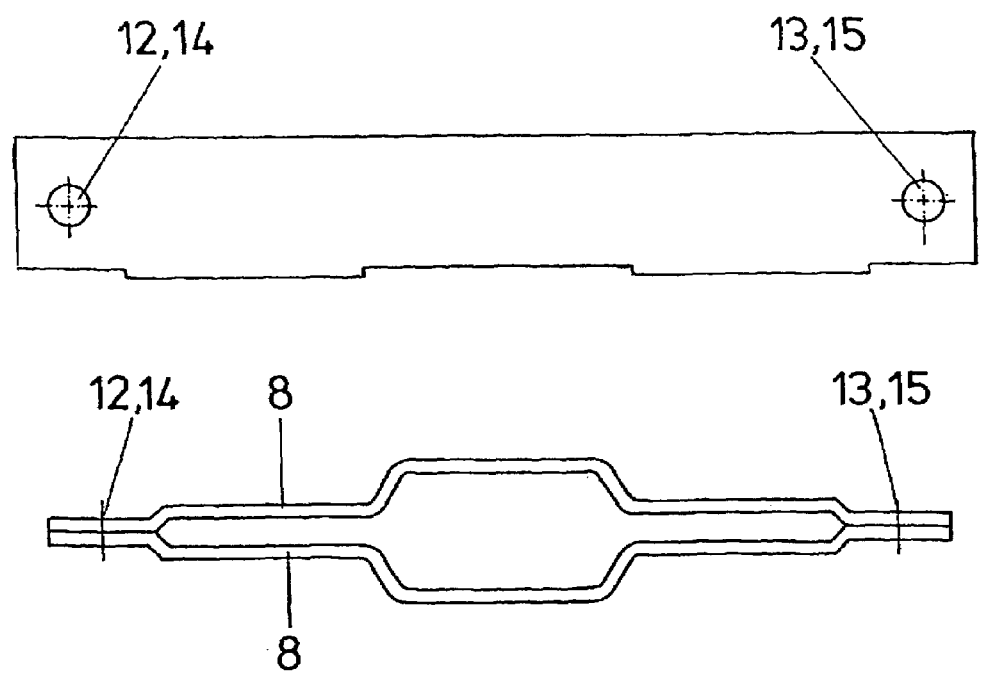

CURRENT TRANSFORMER FOR A COMPENSATING CURRENT SENSOR

This application claims priority to German Patent Application No. 100 11 050.9 filed on Mar. 7, 2000 and International Application No. PCT/EP01/02460 filed on Mar. 5, 2001, the entire contents of which are hereby incorporated by reference.

The invention relates to a current transformer for a compensating current sensor having at least one primary conductor, a secondary winding, and a soft magnetic core, whereby the secondary winding does not completely wind around the core, whereby the primary conductor and secondary winding are electrically insulated from one another and are magnetically intercoupled via the core, and whereby the primary conductor is provided for injecting a current to be detected and the secondary winding is provided for injecting a compensating current.

Current sensors are supposed to be small and reasonably priced but, at the same time, have a wide measuring range. The use of current sensors according to the compensation principle (compensating current sensors) is preferred here. Such a compensating current sensor is known from European Patent 0 294 590, for example. In a current transformer according to this patent, the magnetic field generated in a magnetic core by a primary winding traversed by the current to be measured, is compensated by the magnetic field generated in a secondary winding traversed by a compensation current. The known compensating current sensor exhibits a ring-shaped core, through which the primary conductor leading to the current to be detected is pulled and is covered around the entire circumference by the secondary winding. Through the latter, an even distribution of the magnetic flow over the entire circumference of the core is achieved, as a result of which a wide measuring range is advantageously achieved.

However, a complete wrapping of the core for many applications is too costly and/or difficult to construct. The problem here, however, is that in current sensors having only a partially covered core, the flow is injected only in a certain area of the core, in which the magnetic field probe is normally arranged. In this area, the magnetic flow is compensated to zero by the compensating coil. Because the flow of the compensating coil that only partially encloses the core does not completely close the core, but partially closes as stray flux in free space, the flow in the core is no longer completely compensated outside the compensating coil. When the current intensity increases, the material can therefore go into saturation outside the compensating coil. The linear measuring range of the current transformer, and consequently, of the entire compensating current sensor, is thus limited by this saturation effect. However, a wider measuring range is normally desirable even for these applications.

It is known that an enhancement of the measuring range may be achieved by dividing the primary conductor, in which a portion of the current is led through the current sensor and a portion is conducted past the sensor. The enhancement of the measuring range corresponds exactly to the distribution ratio of the current to be measured. This means that with a current distribution of 1:4, a measuring range enhancement of 5 is achieved.

For example, taking the distributed primary conductor around the core is known from DE-OS 2 303 906. In the process, an AC converter is realized, equipped with a squirrel cage winding. This attenuates the flow in the core by the quotients from the impedance of this squirrel cage winding and by the ohmic resistance of the squirrel cage winding. A receiving coil supplies a voltage proportional to the change over time of the magnet flux, and consequently, the energizing current. On the one hand, this is an arrangement to be operated only with alternating current, and on the other hand, the output voltage is greatly dependent on the ohmic resistance of the short-circuit ring, and consequently, on the temperature. Nevertheless, no satisfactory enhancement of the measuring range is achieved even in this manner.

The task of the present invention is to specify a current transformer for a compensating current sensor, which has a wide measuring range despite low cost.

The task is achieved by a current transformer in accordance with Patent Claim 1. The embodiments and developments of the inventive idea are the subject matter of subclaims.

The advantage of the present invention is the ability to use smaller cores and/or an unsymmetrical lapping since saturation effects and non-homogeneous magnetic fluxes are extensively compensated for.

In particular, in a current transformer of the type mentioned at the start, at least one additional conductor is provided, which is electrically connected in parallel to the primary winding and is arranged in the area of the core where a flux rise occurs, in such a way that the flux rise is compensated for at least partially.

The present invention is based on the fact that a current distribution, and consequently, a measuring range enhancement, is initially effected in the conventional sense via the additional conductor, but that however, the special arrangement of the additional conductor achieves a measuring range enhancement beyond this. The additional conductor led externally, past the core, is now placed such that the magnetic flow injected through this portion of the primary conductor (additional conductor) compensates for the magnetic flux in the outer areas of the core. This means that the magnetic flow in the core originating from this portion of the primary conductor (additional conductor) replaces the stray flux of the compensating coil, which is lacking for the compensation. It is in this manner that measuring range enhancements that go well beyond the values achievable through conventional current distribution are achieved.

In particular, the additional conductor is arranged beside the core in such a way that only certain areas of the core are detected by its magnetic flow.

For example, if several increases in the current occur in various sites of the core, at least one other additional conductor may be provided, which is electrically connected in parallel [to] the primary conductor and the additional conductor, and which is arranged beside the core in such a way that only certain areas of the core are correspondingly detected by its magnetic flow.

Primary conductor and additional conductor(s) preferably conduct currents of different strengths, with the sum of the currents giving rise to the current to be detected. In this manner, a maximum of linearity, and consequently, a maximum measuring range, can be achieved for every geometry (core and windings) through an optimal current distribution.

When primary conductor and additional conductor(s) are not coiled up, i.e., number of turns is less than one, so-called straight-through transformers can be realized, for example, in which the primary conductor leading to the current to be detected is led through by a ring-like core.

In a preferred embodiment, primary conductor and additional conductor(s) can be formed by an essentially rectilinear conductor in the area of the core or an essentially U-shaped conductor in the area of the core. The U-shaped formation of primary conductor and additional conductor(s) while interleaving the individual conductors further widens the measuring range because the U-shape, in particular, causes a slight saturation of the core.

If primary conductor and additional conductor(s) are formed by a single, slotted conductor, there are advantageously no contact resistances changing with the time or the temperature at the otherwise necessary contact sites of primary conductor and additional conductor among themselves, as a result of which the measuring accuracy is improved.

A return conductor, which is arranged beside the core on the side of the core opposite the other additional conductor(s), and which is traversed in the opposite direction of the primary conductor and additional conductors by the current to be detected, can moreover likewise increase the measuring accuracy by compensating for negative flow rises.

Primary conductor and additional conductor(s), secondary winding, and core, may in the end at least partially, individually or together, be encompassed by a shielding plate. This relieves the core and reduces the influence of the noise fields that would unfavorably affect the measuring range.

The present invention is explained in greater detail in the following, using the embodiments illustrated in the figures of the drawing.

Figure 2:
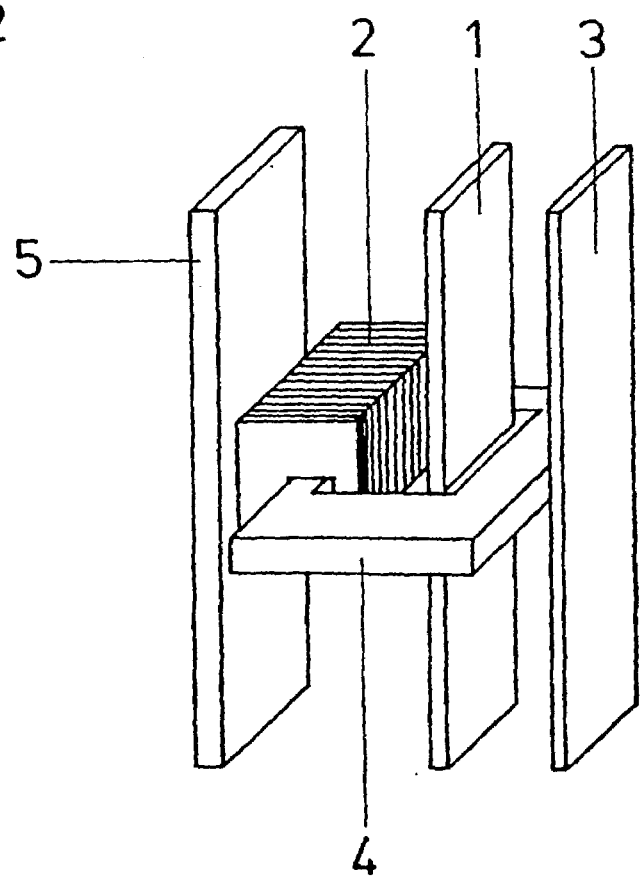
Figure 3:
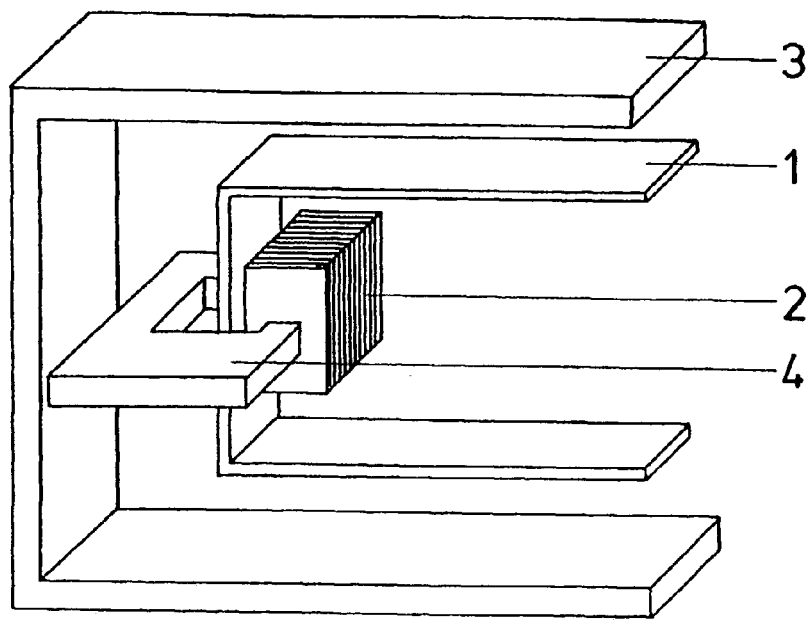
Figure 4:
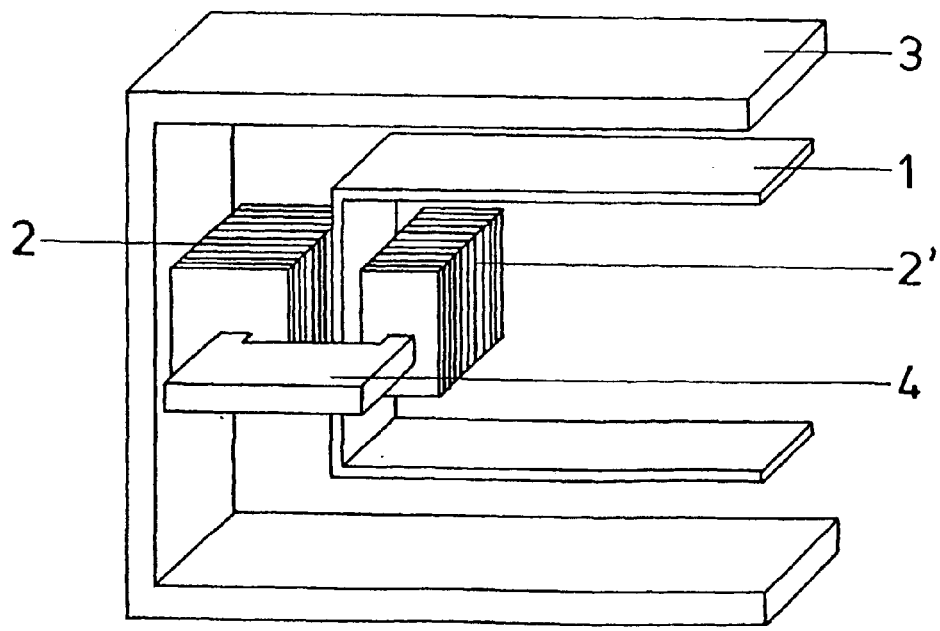
Figure 5:
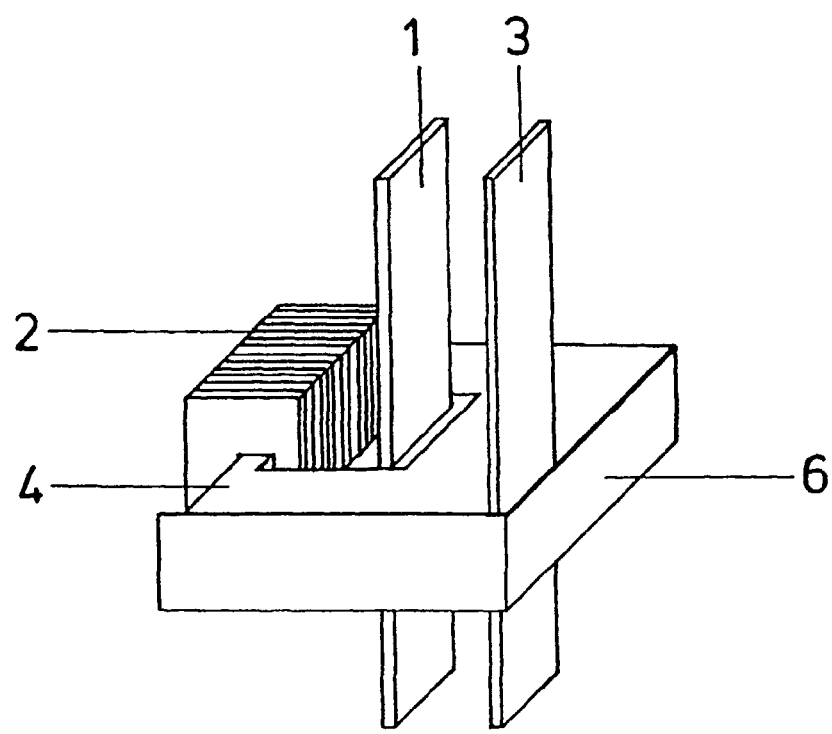
Figure 8:
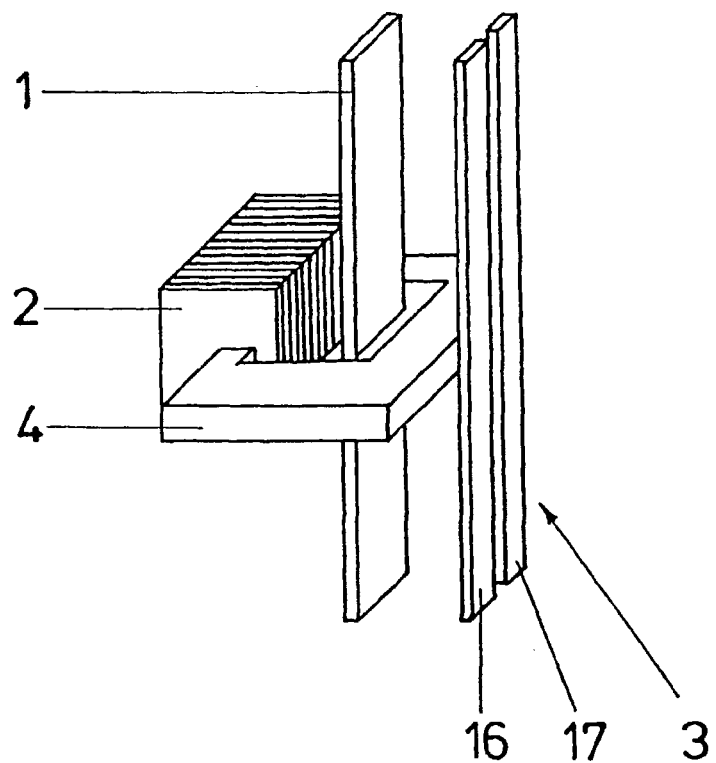
Figure 6:
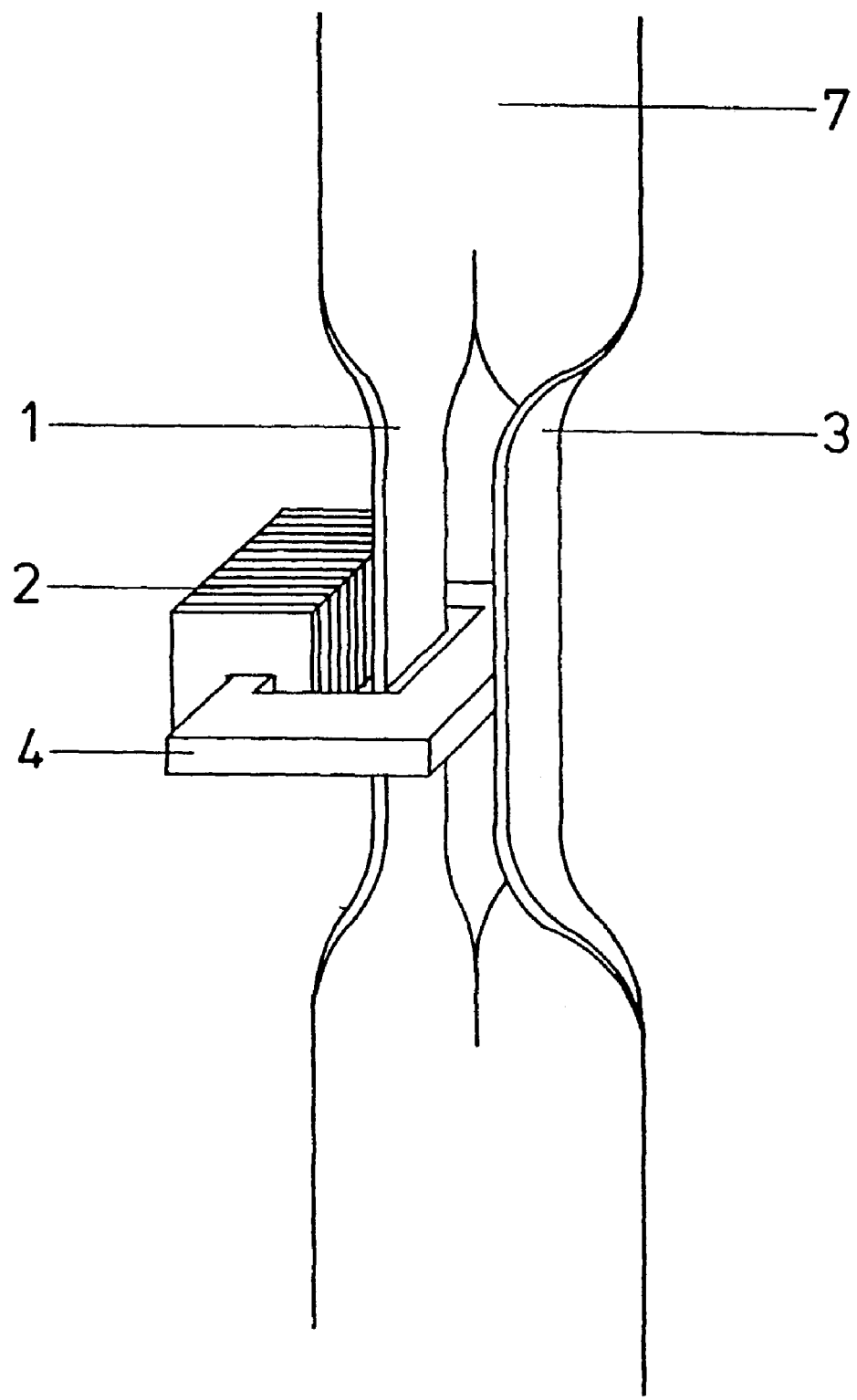
Figure 9A:
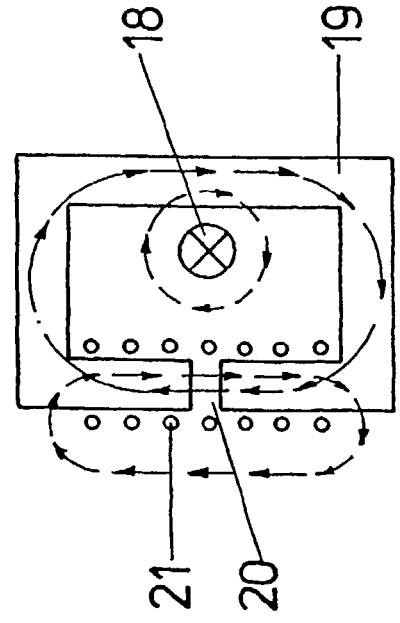
Figure 9B:
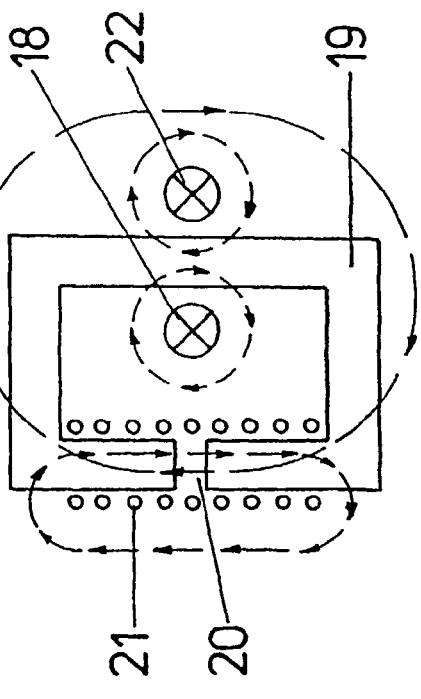
Figure 10A:
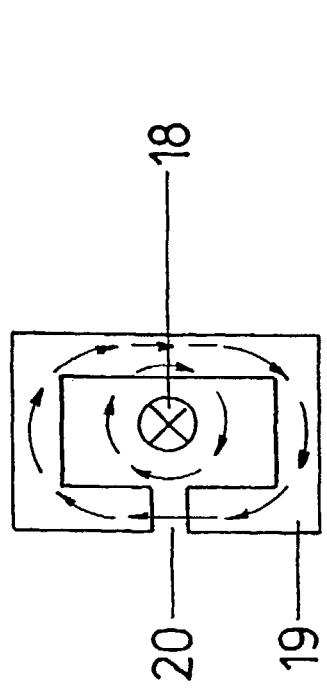
Figure 10B:
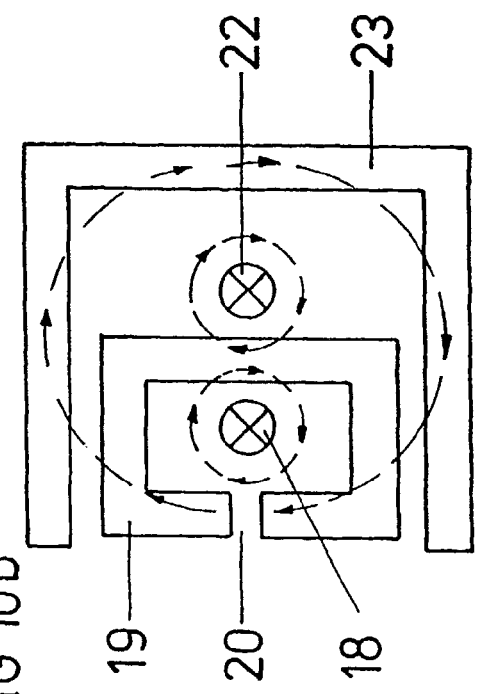

Shown are:

FIG. 1 a first, general embodiment of a current transformer according to the present invention, FIG. 2 a second embodiment of a current transformer according to the present invention, with a conductor conducting an opposing current, FIG. 3 a third embodiment of a current transformer according to the present invention, with two U-shaped conductors that are interleaved, FIG. 4 a fourth embodiment of a current transformer according to the present invention, which, as opposed to the embodiment shown in FIG. 3, is enhanced by a further secondary coil, FIG. 5 a fifth embodiment of a current transformer according to the present invention, with a shielding plate, FIG. 6 a sixth fifth embodiment of a current transformer according to the present invention, with a slotted, one-piece conductor, FIG. 7 the format of a preferred, one-piece, slotted conductor in detail, FIG. 8 a seventh embodiment of a current transformer according to the present invention, with two conductors arranged beside the core, FIG. 9 the course of the line of electric flux of a current transformer according to the present invention, with two primary conductors, in comparison with a conventional current transformer, and FIG. 10 the course of the line of electric flux of a current transformer according to the present invention, with shielding plate, in comparison with a conventional current transformer.

In the embodiment shown in FIG. 1 of a current transformer according to the present invention, an additional conductor is provided, aside from a primary conductor and a secondary winding 2, with the primary conductor and additional conductor each being designed as microstrip 1 or 3. Instead of microstrips, any other form of conductor could be used in the same manner. Secondary winding 2 has a plurality of windings and is arranged around this via an air gap (not shown in FIG. 1) of soft magnetic core 4. Core 4 has an essentially rectangular cross-section and is designed in a ring shape, originating from the air gap, in such a way that the base is approximately rectangular. Instead of a rectangular base and a rectangle-shaped cross-section, however, any other base and cross-sectional area facilitating a circular shape of core 4, such as for example, an oval, round area, etc., could be used.

In the process, microstrip 1 (primary conductor) penetrates the base of core 4 in an essentially straight line, in such a way that it is surrounded over the full circumference by its air gap, as seen from core 4. Secondary winding 2 surrounds only a part of core 4 (in the embodiment, less than one fourth of the circumference). In accordance with the present invention, a second microstrip 3 (additional conductor), which is electrically connected in parallel to the first microstrip 1 (primary conductor), is outside of core 4, but in its immediate vicinity, and with respect to the first microstrip 1 (primary conductor), arranged opposite the secondary winding. Microstrip 3 serving as additional conductor generates a magnetic flux in the process, which compensates for the uneven flow distribution in core 4, caused by secondary winding 2 only partially enclosing core 4, and for example, microstrip 1 (primary conductor) arranged unsymmetrically within the core.

The embodiment according to FIG. 2 follows from the embodiment shown in FIG. 1, in that a return microstrip 5 is provided in addition, which is arranged opposite microstrip 3, near the secondary winding 2, and which conducts a current that flows in the opposite direction of microstrips 1 and 3 and is equal to the sum of the currents through microstrips 1 and 3. On account of the position opposite microstrip 3 and opposite the current direction, there is on the whole a strengthening of the effect created by microstrip 3 (additional conductor).

In the embodiment according to FIG. 3, the microstrips are U-shaped, as opposed to the embodiment shown in FIG. 1. The U-shape results in a winding with 0.75 number of turns. Here, the two microstrips 1 and 3 continue to run parallel, resulting in two interleaved "U's". The distance between the corresponding sides of the U-shaped microstrips 1 and 3 with respect to one another can also be reduced in view of the distance in the area of core 4, by which the influence of noise fields caused by the current supply can be reduced. The U-shape on the whole offers a wider measuring range.

In the arrangement shown in FIG. 4, as opposed to FIG. 3, an additional secondary coil 2' is also provided, which is electrically connected, for example in series to secondary coil 2. The secondary coil 2' is opposite secondary coil 2 here, or arranged between microstrips 1 and 3, enclosing the core 4. This measure also allows the measuring range to be linearized, and consequently, enlarged.

The embodiment according to FIG. 5 follows from the embodiment shown in FIG. 1 in that a U-shaped shielding plate 6 surrounds core 4 as well as microstrips 1 and 3. Shielding plate 6 originates here from the two sides of core 4 that are found at the side of secondary winding 2 and runs parallel thereto and, including the two microstrips 1 and 3, also parallel to the section of core 4 opposite secondary coil 2. Through shielding plate 6, the influence of noise fields, which could reduce the measuring range, is decreased and the measuring range is enhanced, moreover, since the core is also relieved.

In the embodiment according to FIG. 6, microstrip 7 is provided, originating from core 4 and secondary coil 2 of the previous embodiments, the microstrip being slotted in the area of core 4 and forming two partial microstrips resulting in microstrip 1 and 3. The partial microstrips are turned by 90 degrees to the non-slotted area of microstrip 7. Because of the one-piece design of microstrip 7, the two microstrips 1 and 3 have no points of contact, thereby avoiding interference-prone points of contact.

A preferred embodiment of a one-piece implementation of microstrips 1 and 3 as a one-piece, slotted microstrip 8 is shown in FIG. 7. Shown in detail here in FIG. 7a is the structure before and in FIG. 7b the structure of microstrip 8 after performing a bending process. According to FIG. 7a, microstrip 8 has a rectangular basic shape, where lengthwise, or parallel to the longer edges, there are three slots 9, 10, 11 at approximately half the width, of which a 9 is arranged lengthwise in the middle and two 10, 11 are arranged on the side edges. Microstrip 8 is symmetrically structured with respect to a symmetry line running in its middle at a right angle to the longitudinal direction as well as a symmetry line running along slots 9, 10, 11. Originating from each of the two side edges containing slots 10 and 11, microstrip 8 is bent at approximately the height of the ends of slots 10 and 11 facing the center, in such a way that there is on the whole an indentation opposite the mentioned side edges, with a further indentation being provided in the area of slot 9. Finally, near the corners are holes 12, 13, 14, 15, which are symmetrically arranged at least with respect to the symmetry line running along slots 9, 10, 11.

Originating from this basic form, in accordance with FIG. 7b, microstrip 8 is bent at the symmetry line running along slots 9, 10, 11, in such a way that two each of holes 12, 14 or 13, 15 come to be on top of the other. The form resulting from curving the strip conductor 8 is that the strips comprising holes 12, 13, 14, 15 are close to each other at the margins having slits 10, 11, and open at a first recess. The distance between the two parts of microstrip 8 is greatest in the area of the second indentation (around slot 9). This part serves to accommodate the core.

In the embodiment shown in FIG. 8, originating from the embodiment shown in FIG. 1, the other microstrip 3 is divided into two partial microstrips 16 and 17 running parallel to one another, which are positioned in such a way that they offer an optimal compensation of flux rises.

FIG. 9 shows how a flux rise is caused in a current transformer of the conventional type (FIG. 9a), for example through unsymmetrical arrangement of a (primary) conductor 18 within a ring-shaped core 19 with air gap 20. A secondary coil 21 is coiled up around the core 19 via the air gap 20, the secondary coil being shown in the drawing in profile for better overview. At the section of the core 19 (short-circuit core) across secondary coil 21, a flux rise occurs due to a non point-symmetrical arrangement of (primary) conductor 18, the flux rise coming about on account of magnetic flux of (primary) conductor 18.

If according to the present invention (FIG. 9b), a "divided conductor", i.e., the (primary) conductor 18 and an additional conductor 22 electrically connected in parallel, are now led through on both sides of the section of core 19 (short-circuit core) exhibiting the rise, the lines of electric flux cancel each other out again and the resulting magnetic field is equal to zero. As a result, the measuring range increases not just by the factor of the current distribution between conductors 18 and 22, but also by the product of the current distribution (ratio of the total current to the portion of the measured current ratio) and the measuring range enhancement of the current sensor (ratio of the "normal" measuring range to the measuring range in the arrangement according to the present invention). If, for example, in the arrangement according to FIG. 9b, only the half current (current distribution factor 2) is conducted via conductor 18, the result is a measuring range enhancement of 1.36 and an enhancement of the linear measuring range to 2.72 times the amount. A conventional current sensor with 75 amperes could, upon application of the present invention, consequently be brought to the linear measuring range of 190 amperes. A current distribution factor of 5 results in a measuring range enhancement of the current sensor to approximately 1000 amperes.

An even higher current distribution (for example, factor 9) results in a magnetizing of the short-circuit core through the additional conductor 22, and as a result, a positive, linearity error at high currents. In order to facilitate even greater measuring ranges here, the distance of the additional conductor to the short-circuit core must be increased at a specified distance of (primary) conductor 18. By varying the current distribution and/or distances, the current sensor may therefore be set to the maximum measuring range.

In FIG. 10, the effect of shielding plate 23 in an arrangement according to FIG. 9b as opposed to a conventional arrangement according to FIG. 9a is shown, the secondary coil having been left out in both. Through shielding plate 23, the magnetic field generated by conductors 18 and 22 is further homogenized, and conducted only via the section of the core 19, comprising the gap 20.

The invention claimed is:

1. A current transformer for a compensating current sensor having a primary conductor, a secondary winding, and a soft-magnetic core incorporating an air gap,
    wherein the secondary winding does not completely wind around the core,
    wherein the primary conductor and the secondary winding are electrically insulated from one another and are magnetically intercoupled via the core, and
    wherein the primary conductor is provided for injecting a current to be detected and the secondary winding is provided to detect a compensating current, comprising an additional conductor that is electrically connected in parallel to the primary conductor and is arranged in the area of the core, at which a flux rise occurs, with the flux rise being at least partially compensated for by the flux caused by current flowing in the additional conductor.

2. The current transformer according to claim 1, wherein the additional conductor is arranged beside the core in such a way that only certain areas of the core are detected by its magnetic flow.

3. The current transformer according to claim 1 wherein at least a second additional conductor is provided, which is electrically connected in parallel to the other two and is arranged beside the core in such a way that only certain areas of the core are detected by their magnetic flow.

4. The current transformer according to claim 1 wherein the primary conductor and the additional conductor conduct currents of different strengths, with the sum of the currents giving rise to the current to be detected.

5. The current transformer according to claim 1 wherein the primary conductor and the additional conductor exhibit number of turns that are less than one.

6. The current transformer according to claim 5 wherein the primary conductor and the additional conductor are formed by an essentially rectilinear conductor in the area of the core.

7. The current transformer according to claim 5 wherein the primary conductor and the additional conductor are formed by an essentially U-shaped conductor in the area of the core.

8. The current transformer according to claim 5 wherein the primary conductor and/or the additional conductor are formed by a one-piece slotted conductor.

9. A current transformer for a compensating current sensor having a primary conductor, a secondary winding, and a soft-magnetic core, wherein (a) the secondary winding does not completely wind round the core, (b) the primary conductor and the secondary winding are electrically insulated from one another and are magnetically intercoupled via the core, and (c) the primary conductor is provided for injecting a current to be detected and the secondary winding is provided to detect a compensating current, comprising an additional conductor which is electrically connected in parallel to the primary conductor and is arranged in the area of the core, at which a flux rise occurs, with the flux rise being at least partially compensated for by the flux, which is caused by the current flowing in the additional conductor, and a return conductor which is arranged on the side of the core opposite the additional conductor and which is traversed in the opposite direction of the additional conductor by the current to be detected.

10. The current transformer according to claim 1 wherein the primary conductor, the additional conductor, the secondary winding and the core are surrounded at least partially by a shielding plate.

* * * * *